United States Patent
Li et al.

(10) Patent No.: US 7,312,668 B2
(45) Date of Patent: Dec. 25, 2007

(54) HIGH RESOLUTION PWM GENERATOR OR DIGITALLY CONTROLLED OSCILLATOR

(75) Inventors: Qiong M. Li, Cortlandt Manor, NY (US); Demetri Giannopoulos, Norwalk, CT (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/559,837

(22) PCT Filed: Jun. 8, 2004

(86) PCT No.: PCT/IB2004/050866
§ 371 (c)(1),
(2), (4) Date: Dec. 8, 2005

(87) PCT Pub. No.: WO2004/109917
PCT Pub. Date: Dec. 16, 2004

(65) Prior Publication Data
US 2006/0164176 A1 Jul. 27, 2006

Related U.S. Application Data

(60) Provisional application No. 60/477,701, filed on Jun. 11, 2003.

(51) Int. Cl.
*H03B 27/00* (2006.01)
(52) U.S. Cl. .......................... 331/57; 331/1 A; 331/34; 331/74; 327/156; 327/175; 327/176
(58) Field of Classification Search ............... 331/1 A, 331/34, 57, 74; 327/156, 175, 176
See application file for complete search history.

(56) References Cited

U.S. PATENT DOCUMENTS

| 5,712,582 A | 1/1998 | Yokota |
| 5,883,534 A * | 3/1999 | Kondoh et al. ............ 327/156 |
| 6,147,532 A | 11/2000 | Ueda |

FOREIGN PATENT DOCUMENTS

DE  100 06 927 A1  12/2000

* cited by examiner

*Primary Examiner*—Arnold Kinkead
(74) *Attorney, Agent, or Firm*—Paul Im

(57) ABSTRACT

A high resolution pulse width modulation (PWM) or voltage controlled output (DCO) generator is disclosed. The resolution is increased over that of the circuit clock by delaying the generated signal through a series of delays, all of which are controlled by a delay locked loop. The delays are a small fraction of the clock period, thus providing resolution greater than that of the circuit clock.

13 Claims, 2 Drawing Sheets

HIGH RESOLUTION PWM GENERATOR OR DIGITALLY CONTROLLED OSCILLATOR

CROSS REFERENCE TO RELATED APPLICATION

This application claims the benefit of U.S. provisional application Ser. No. 60/477,701 filed Jun. 11, 2003 which is incorporated herein in whole by reference.

This invention relates to oscillators, and in the preferred embodiment, an improved method and apparatus for use in Pulse Width Modulation (PWM) and Digitally Controlled Oscillator (DCO) circuits. The invention has particular applicability in areas where it is desired to increase the resolution of a PWM or DCO without increasing the clock speed.

PWM and DCO circuits are used in a variety of applications, including, for example lamp drivers. Such circuits usually utilize a counter having a clock input to generate on and off time periods in an output signal. Typically, the contents of the register are compared with a counter, and the counter is reset each time it reaches the value stored in the register.

The time resolution of the PWM circuit depends upon the clock frequency. A very high clock frequency results in an improved time resolution. However, increased frequencies of the clock lead to higher power consumption and electromagnetic interference (EMI). Additionally, the integrated circuit (IC) fabrication processes to produce ICs that can operate as such high frequencies are significantly more expensive than their lower frequency counterparts.

Accordingly, there is a need in the art for an improved technique for achieving relatively high time resolution with a relatively low clock signal for use in PWM and DCO circuits.

Figure 1:
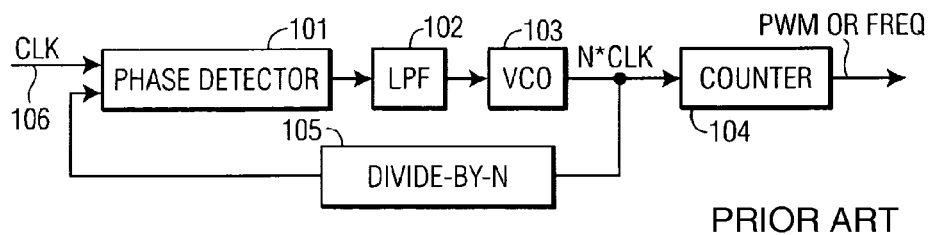
FIG. 1 depicts a conventional prior art implementation of a PWM or DCO generator.
Figure 2:
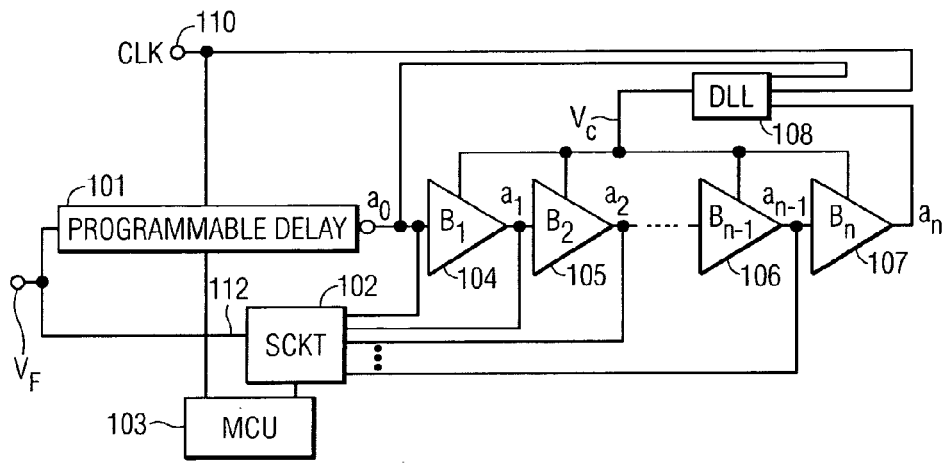
FIG. 2 shows a schematic of a DCO generator using a relatively low clock rate and relatively high time resolution in accordance with the invention.

FIG. 2 shows a DCO generator with improved time resolution. The arrangement of FIG. 2 includes the programmable delay 101, a selector 102, a microprocessor 103 for controlling the system as shown; delay elements 104-107 arranged with a delay locked loop 108, and a variety of interconnections between the foregoing elements. As further described, the circuit permits time resolution higher than the rate of clock 110 that is input into the arrangement.

In operation, a clock 110 and signal $V_f$ are input into a programmable delay 101 that has been programmed to delay the input signal $V_f$ by a specified number of clock cycles. After the appropriate delay, an inverted delayed version of the signal $V_f$ is placed upon output $a_0$ and fed sequentially through delay elements b1-bn. A delay locked loop 108 is connected to delay elements 104-107 and functions to maintain the entire delay through all of delay elements 104-107 to be a single clock cycle. Accordingly, each delay element (e.g. 105) delays the signal by 1/n of the clock cycle. Selector 102 may be configured via microprocessor 103 to select one of its inputs for conveying to its output 112.

Once the signal $V_f$ enters programmable delay 101, a delayed version of that signal is output onto each of the outputs $a_0$-$a_n$. One of those outputs $a_0$-$a_{n-1}$ is fed back through selector 112, causing an inverted version of the signal to be fed into programmable delay 101, and repeating the cycle all over. Thus, the signal $V_f$ will oscillate and can be tuned at resolutions higher than that of the clock frequency.

Figure 3:
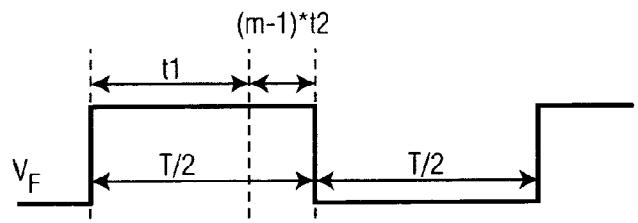
FIG. 3 depicts plural waveforms showing the time resolution resulting from the arrangement of FIG. 2.

The time resolution of the circuit is thus not limited to the frequency of clock 110. Because the delay of all of elements 104-107 is a single clock cycle, the resolution achieved by selecting one of the delayed outputs is n times the resolution that the clock 110 would normally provide in prior art circuits. This is shown pictorially in FIG. 3, where t1=the delay programmed into programmable delay 101, m is an index variable that ranges in value from 1 to n, and T is the period of $V_f$.

Figure 4:
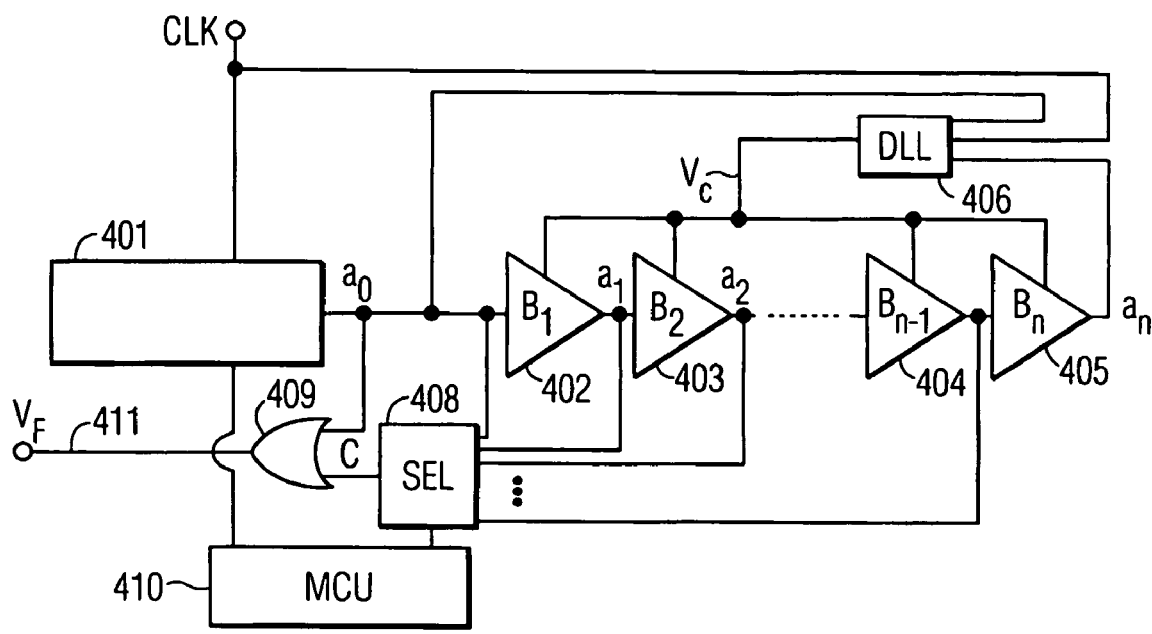
FIG. 4 depicts an exemplary embodiment of the invention for generating a PWM signal with relatively high time resolution.

FIG. 4 shows an alternative embodiment of the present invention for generating a pulse width modulated (PWM) signal. The system includes a programmable pulse width modulator circuit 401, a plurality of delay elements 402-405, a delay locked loop 406 similar to that of FIG. 2, a selector 408 for selecting one of inputs $a_0$ through $a_n$ to the selector to convey to the selector output, and a logic gate 409 connected to the selector output. In operation, the programmable PWM outputs a PWM signal of a fixed duty cycle set in accordance with instructions from microprocessor 14. The waveform that is output by programmable PWM generator 401 is shown as $a_0$ in FIG. 5. In accordance with the inventions, the delay locked loop 406 maintains the delay of one full clock cycle through delay elements 402-405. Accordingly, each output is delayed by 1/n of the clock frequency, $T_{clk}$.

The selector 408 selects one of the inputs for conveyance to logic gate 409, which is shown as an OR gate. The output 411 will be on as long as either the PWN signal is on, or a delayed version of that signal remains on. Since the delayed version may be delayed by an amount that is less than the period of the clock, the PWM signal can have a time resolution n times not of the clock frequency.

Figure 5:
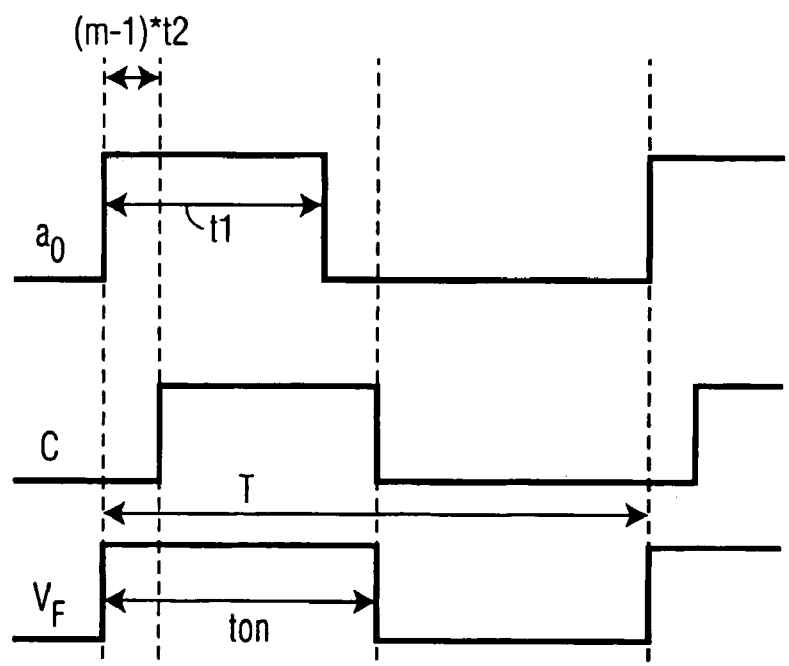
FIG. 5 depicts several graphs showing the relatively high time resolution of the arrangement of FIG. 4.

Several exemplary relevant waveforms generated by the arrangement of FIG. 4 are shown in FIG. 5. $a_0$ represents the PWM signal produced directly at the output of programmable PWM 401. The second signal C represents a slightly delayed version of the signal that is conveyed through selector 408 as shown in FIG. 4. The resulting PWM signal remains on for an amount of time that may be varied in increments of $T_{clock}/n$. The specific delay experienced depends upon which delay is selected by selector 408 in response to instructions from microprocessor 410. Delay locked loop 406 maintains the appropriate delays in each of delay elements 402-405 such that the delay can be controlled independent of temperature and process variations.

While the foregoing describes the preferred embodiment of the inventions, various other modifications or additions will be apparent to those who are skilled in the art. Such modification are intended to be covered by the claims appended hereto.

The invention claimed is:

1. Apparatus for increasing the time resolution of a clock in an electronic device; said apparatus comprising:
    a first delay element having an input for receiving and delaying an input signal by a first amount of time to produce an output signal;
    a second delay element for delaying said output signal as a function of a predetermined fraction of a period of said clock to produce a second output signal;

a feedback path for transmitting said second output signal to said input of said first delay element and an inverter for inverting either said output signal or said second output signal.

2. The apparatus of claim 1 wherein the first delay element comprises a programmable delay element.

3. The apparatus of claim 2 wherein said second delay element includes plural third delay elements in combination with a selector for selecting one of the plural delay elements.

4. The apparatus of claim 3 further comprising a microprocessor connected to both the selector and the programmable delay element for programming the proper delay into the programmable delay element and for selecting an output from one of said third delay elements to feed back to the input of said programmable delay.

5. The apparatus of claim 4 further comprising a delay lock loop connected to said third delay elements to cause total delay introduced by all of said third delay elements to be equal to a period of said clock.

6. Apparatus for generating a pulse width modulated (PWM) signal from a clock having lower resolution than that of said PWM signal, said apparatus comprising:

a first delay element for delaying an input signal by a first predetermined amount to produce a first output signal;

a second delay element for delaying said first output signal as a function of a predetermined fraction of a period of said clock to produce a second output signal; and a logic gate for performing a logic function with respect to said first and second outputs.

7. The apparatus of claim 6 wherein said logic gate is an OR gate or and AND gate.

8. The apparatus of claim 7 wherein said second delay element comprises plural third delay elements and a selector for selecting an output of one of said third delay elements.

9. The apparatus of claim 8 wherein said third delay elements are arranged in series such that a total delay introduce by all of said third delay elements is equal to one period of a clock, the clock also being configured to drive the first delay element.

10. The apparatus of claim 9 further comprising a delay lock loop for maintaining appropriate delays of each of said third delay elements.

11. A method of producing a Pulse Width Modulated (PWM) signal from a clock said method comprising:

receiving in an OR gate a first signal and a second signal, the second signal being selected from plural third signals, each of said plural third signals being equal to a delayed version of said first signal as a function of a plural of predetermined fractions of a period of said clock, said delay being equal to T/n, where n is a selected one of a different integer for each of said third signals, and T is a clock signal.

12. The method of claim 11 further comprising connecting a delay lock loop to plural delay elements to generate said third signals.

13. The method of claim 11 wherein an original signal is delayed by a preprogrammed amount and subsequently by plural delays of equal value.

* * * * *